(12) United States Patent
Rana et al.

(10) Patent No.: US 12,119,352 B2
(45) Date of Patent: Oct. 15, 2024

(54) IC STRUCTURE INCLUDING POROUS SEMICONDUCTOR LAYER IN BULK SUBSTRATE ADJACENT TRENCH ISOLATION

(71) Applicant: GlobalFoundries U.S. Inc., Malta, NY (US)

(72) Inventors: Uzma B. Rana, Slingerlands, NY (US); Steven M. Shank, Jericho, VT (US); Anthony K. Stamper, Burlington, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 157 days.

(21) Appl. No.: 17/647,176

(22) Filed: Jan. 6, 2022

(65) Prior Publication Data
US 2023/0215869 A1    Jul. 6, 2023

(51) Int. Cl.
*H01L 27/12* (2006.01)
*H01L 21/762* (2006.01)

(52) U.S. Cl.
CPC .... *H01L 27/1207* (2013.01); *H01L 21/76283* (2013.01)

(58) Field of Classification Search
CPC ........... H01L 27/1207; H01L 27/76224; H01L 21/763; H01L 29/7686; H01L 27/1203; H01L 27/0255; H01L 27/0814
USPC .......................................... 257/347; 438/149
See application file for complete search history.

(56) References Cited

U.S. PATENT DOCUMENTS

| | | | |
|---|---|---|---|
| 5,723,896 | A | 3/1998 | Yee et al. |
| 6,627,507 | B2 | 9/2003 | Yuan |
| 6,683,367 | B1 | 1/2004 | Stalmans et al. |
| 6,774,435 | B1 | 8/2004 | Matsumoto et al. |
| 7,772,082 | B2 | 8/2010 | Choi |

(Continued)

FOREIGN PATENT DOCUMENTS

EP         0116702 A2     8/1984

OTHER PUBLICATIONS

U.S. Appl. No. 17/450,003, entitled "IC Structure Including Porous Semiconductor Layer Under Trench Isolation," filed Oct. 5, 2021.

(Continued)

*Primary Examiner* — Fernando L Toledo
*Assistant Examiner* — Neil R Prasad
(74) *Attorney, Agent, or Firm* — Francois Pagette; Hoffman Warnick LLC (57) ABSTRACT

An integrated circuit (IC) structure, a switch and related method, are disclosed. The IC structure includes an active device, e.g., a switch, over a bulk semiconductor substrate, and an isolation structure under the active device in the bulk semiconductor substrate. The isolation structure may include a trench isolation adjacent the active device in the bulk semiconductor substrate, a dielectric layer laterally adjacent the trench isolation and over the active device, and a porous semiconductor layer in the bulk semiconductor substrate under the dielectric layer laterally adjacent the trench isolation. The IC structure employs a lower cost, low resistivity bulk semiconductor substrate rather than a semiconductor-on-insulator (SOI) substrate, yet it has better performance characteristics for RF switches than an SOI substrate.

15 Claims, 4 Drawing Sheets

(56) References Cited

U.S. PATENT DOCUMENTS

| | | | |
|---|---|---|---|
| 7,772,083 | B2 | 8/2010 | Botula et al. |
| 8,089,126 | B2 | 1/2012 | Botula et al. |
| 10,755,987 | B2 | 8/2020 | Mason et al. |
| 10,790,170 | B2 | 9/2020 | Reber et al. |
| 10,796,942 | B2 | 10/2020 | Mariani et al. |
| 11,322,387 | B1 | 5/2022 | Rana et al. |
| 2008/0224253 | A1 | 9/2008 | Sagae et al. |
| 2009/0140346 | A1 | 6/2009 | Edwards et al. |
| 2013/0161757 | A1 | 6/2013 | Huang et al. |
| 2017/0317075 | A1* | 11/2017 | Arai et al. .......... H01L 27/0814 |
| 2018/0053764 | A1 | 2/2018 | Salzman et al. |
| 2019/0295881 | A1 | 9/2019 | Shank et al. |
| 2022/0359272 | A1 | 11/2022 | Augendre et al. |
| 2022/0384659 | A1 | 12/2022 | Stamper et al. |
| 2023/0108712 | A1 | 4/2023 | Rana et al. |

OTHER PUBLICATIONS

Chiappini et al., "Tailored Porous silicon microparticles: fabrication and properties," Chemphyschem., 11:1029-35, Apr. 2010 (14 pages).

Kale and Solanki, "Synthesis of Si Nanoparticles from Freestanding Porous Silicon (PS) Film Using Ultrasonication," 978-1-4244-5892-9/10, 2010 IEEE (6 pages).

Marsh, "Porous silicon a useful imperfection," Materials Today, pp. 36-41, Jan. 2001 (6 pages).

U.S. Appl. No. 17/069,098, entitled "Bulk Wafer Switch Isolation," filed Oct. 13, 2020.

U.S. Appl. No. 17/330,780, entitled "Field Effect Transistor," filed May 26, 2021.

Gharbi et al., "Shallow trench isolation based on selective formation of oxidized porous silicon," Microelectronic Engineering, 88:1214-16, Jul. 2011.

Nassiopoulou et al., "Porous Si as a substrate material for RF passive integration," 2013 14th International Conference on Ultimate Integration on Silicon (ULIS), pp. 89-93, 2013.

Rack et al., "Small- and Large-Signal Performance up to 175 of Low-Cost Porous Silicon Substrate for RF Applications," IEEE Transactions on Electron Devices, 65:1887, May 2018.

U.S. Appl. No. 17/069,098, Notice of Allowance dated Jan. 26, 2022, 7 pages.

U.S. Appl. No. 17/069,098, Office Action dated Sep. 1, 2021, 9 pages.

U.S. Appl. No. 17/069,098, Response to Office Action filed Nov. 29, 2021, 10 pages.

U.S. Appl. No. 17/330,780, Final Office Action dated Apr. 18, 2023, 10 pages.

U.S. Appl. No. 17/330,780, Office Action dated Nov. 2, 2022, 10 pages.

U.S. Appl. No. 17/330,780, Response to Final Office Action filed Jun. 2, 2023, 12 pages.

U.S. Appl. No. 17/330,780, Response to Office Action filed Jan. 31, 2023, 12 pages.

Extended European Search Report from European Patent Application No. 22201489.6 dated Apr. 26, 2023.

U.S. Appl. No. 17/450,003, Response to Office Action filed Jan. 23, 2024, 17 pages.

U.S. Appl. No. 17/450,003, Notice of Allowance dated Mar. 29, 2024, 11 pages.

U.S. Appl. No. 17/450,003, Office Action dated Dec. 7, 2023, 33 pages.

Chase, "Ohms Per Square What!," ESD Journal, retrieved from http://www.esdjournal.com/techpapr/ohms.htm on Feb. 20, 2008, 3 pages.

* cited by examiner

IC STRUCTURE INCLUDING POROUS SEMICONDUCTOR LAYER IN BULK SUBSTRATE ADJACENT TRENCH ISOLATION

BACKGROUND

The present disclosure relates to integrated circuit (IC) structures, and more specifically, to an IC structure, such as a radio frequency switch, including an active device with a dielectric layer thereover, and a porous semiconductor layer under the dielectric layer in a bulk semiconductor substrate adjacent a trench isolation.

In integrated circuit (IC) structures, active devices are electrically isolated by dielectrics. The dielectrics may be provided in a number of locations. Dielectric trench isolations typically laterally isolate active devices. In radio frequency (RF) devices such as switches, power amplifiers and other devices, additional isolation layers to reduce harmonics and parasitic losses are advantageous. One current approach uses a semiconductor-on-insulator (SOI) substrate with a trap-rich, high resistivity polycrystalline isolation layer between the buried insulator and the semiconductor substrate. The high resistivity, polycrystalline isolation layer is located below the RF active devices and provides additional isolation to the devices. This approach works well for SOI substrates. However, bulk semiconductor substrates including a high resistivity, polycrystalline isolation layer, exhibit higher harmonics and substrate leakage current than SOI substrates.

SUMMARY

An aspect of the disclosure is directed to an integrated circuit (IC) structure, comprising: an active device over a bulk semiconductor substrate; an isolation structure under the active device in the bulk semiconductor substrate, the isolation structure including: a trench isolation adjacent the active device in the bulk semiconductor substrate, a dielectric layer laterally adjacent the trench isolation and over the active device, a porous semiconductor layer in the bulk semiconductor substrate under the dielectric layer laterally adjacent the trench isolation, and a polycrystalline isolation layer under the active device and the trench isolation, the porous semiconductor layer extending through the polycrystalline isolation layer.

Another aspect of the disclosure includes a radio frequency (RF) switch, comprising: an active device over a bulk semiconductor substrate; and an isolation structure under the active device in the bulk semiconductor substrate, the isolation structure including: a trench isolation adjacent the active device in the bulk semiconductor substrate, a polycrystalline isolation layer under the active device and the trench isolation, a dielectric layer laterally adjacent the trench isolation and over the active device, and a porous semiconductor layer in the bulk semiconductor substrate under the dielectric layer laterally adjacent the trench isolation, the porous semiconductor layer extending through the polycrystalline isolation layer.

An aspect of the disclosure related to a method, comprising: forming a switch over a bulk semiconductor substrate, the switch isolated by a trench isolation in the bulk semiconductor substrate; exposing a region of the bulk semiconductor substrate laterally adjacent and below the trench isolation; forming a porous semiconductor layer in the region of the bulk semiconductor substrate laterally adjacent and below the trench isolation; and forming a dielectric layer over the porous semiconductor layer and the switch.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide an integrated circuit (IC) structure, a switch and related method. The IC structure includes an active device, e.g., a switch, over a bulk semiconductor substrate, and an isolation structure under the active device in the bulk semiconductor substrate. The isolation structure may include a trench isolation adjacent the active device in the bulk semiconductor substrate, a dielectric layer laterally adjacent the trench isolation and over the active device, and a porous semiconductor layer in the bulk semiconductor substrate under the dielectric layer laterally adjacent the trench isolation. The IC structure employs a lower cost, low resistivity bulk semiconductor substrate rather than a semiconductor-on-insulator (SOI) substrate, yet it has better performance characteristics for RF devices than an SOI substrate. For example, the IC structure with the porous semiconductor layer in the semiconductor substrate adjacent the trench isolation exhibits better current leakage, harmonic distortion, cross-talk resistance, effective resistivity, effective permittivity, and attenuation, compared to current SOI substrate devices. The porous semiconductor layer can be formed in the fill shape area adjacent the active device.

Figure 1:
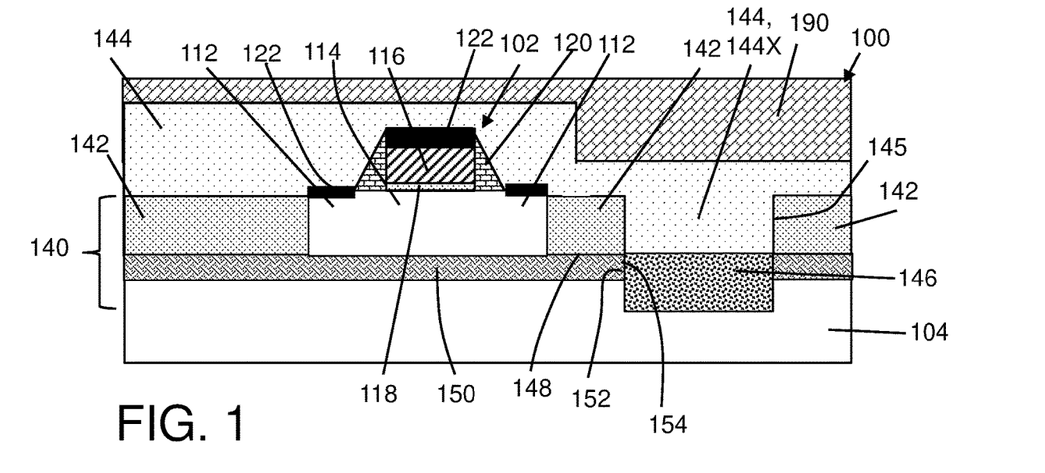
FIG. 1 shows a cross-sectional view of an IC structure and switch, according to embodiments of the disclosure.
Figure 2:
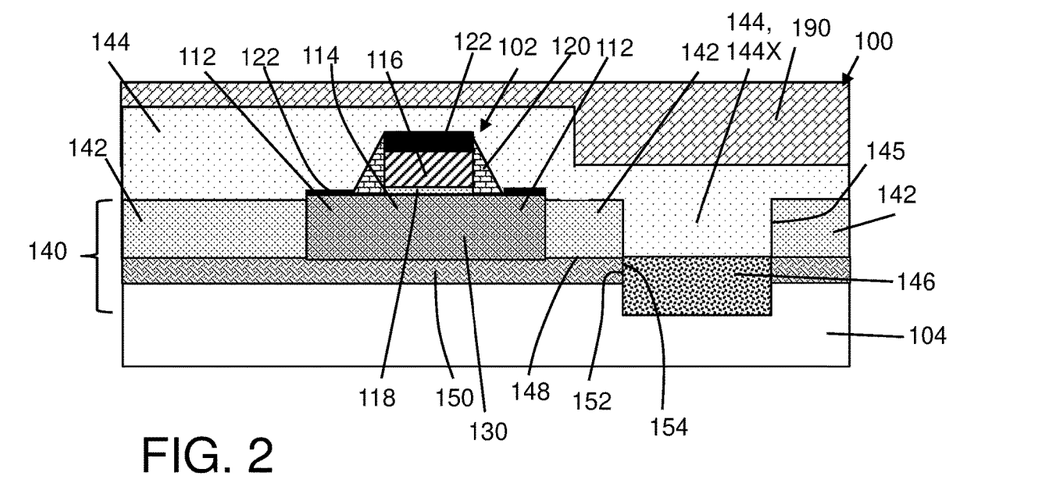
FIG. 2 shows a cross-sectional view of an IC structure and switch, according to other embodiments of the disclosure.
Figure 3:
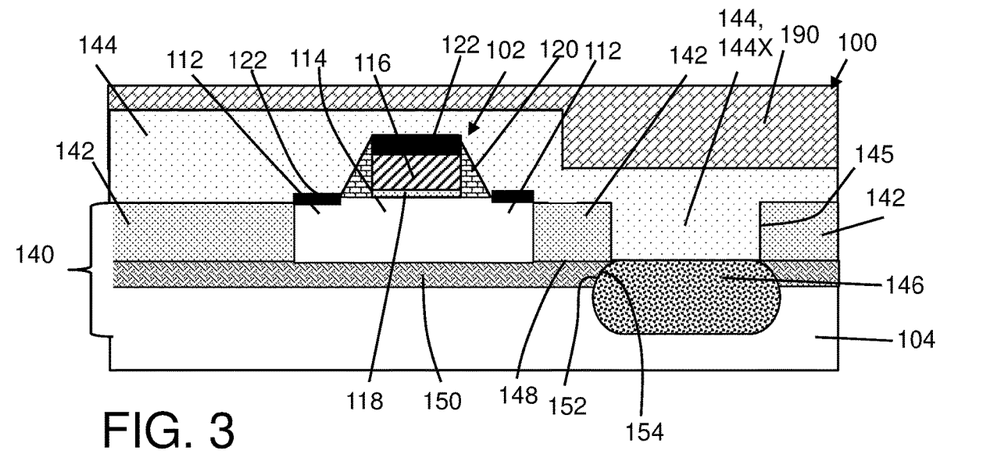
FIG. 3 shows a cross-sectional view of an IC structure and switch, according to yet other embodiments of the disclosure.

FIGS. 1-3 show cross-sectional views of an IC structure 100, according to embodiments of the disclosure. IC structure 100 includes an active device 102 over a bulk semiconductor substrate 104. Bulk semiconductor substrate 104 includes a low resistivity semiconductor material, which is relatively inexpensive to produce compared to a higher resistivity SOI substrate. Bulk semiconductor substrate 104 may include any semiconductor material that can be made porous, as described herein, including but not limited to silicon. Bulk semiconductor substrate 104 is monocrystalline. A portion of or entirety of bulk semiconductor substrate 104 may be strained.

Active device 102 may include any now known or later developed transistor. IC structure 100 may have a wide number of applications. For example, as noted herein, it finds advantageous application as a switch such as a radio frequency (RF) switch. Active device 102 may include, for example, source/drain regions 112, a channel region 114, a gate 116, a gate dielectric layer 118 between gate 116 and channel region 114, and a gate spacer 120 about gate 116. Source/drain regions 112 may include any appropriate dopant within semiconductor substrate 104. Gate 116 may be a metal or polysilicon gate and may include one or more conductive components for providing a gate terminal of a transistor. For example, metal gates 116 may include a high dielectric constant (high-K) layer (gate dielectric layer 118), a work function metal layer and a gate conductor (none shown for clarity). A gate cap (not shown) may also be formed over gate 116.

Gate dielectric layer 118 may include any now known or later developed gate dielectric materials such as but not limited to hafnium silicate (HfSiO), hafnium oxide (HfO$_2$), zirconium silicate (ZrSiO$_x$), zirconium oxide (ZrO$_2$), silicon oxide (SiO$_2$), silicon nitride (Si$_3$N$_4$), silicon oxynitride (SiON), high-k material or any combination of these materials. Spacer 120 may include any now known or later developed spacer material such as silicon nitride. Silicidation 122 for contacts (not shown) may be provided to source/drain regions 112 and gate 116.

As shown in FIG. 1, channel region 114 may include the same semiconductor material as substrate 104 (dopants for source/drain regions 112 and/or channel 114 not shown). In certain embodiments, shown in FIG. 2, active device 102 may include an epitaxial region 130 in which source/drain regions 112 are formed. Epitaxial region 130 has a resistivity higher than bulk semiconductor substrate 104. In one example, bulk semiconductor substrate 104 may have a resistivity of less than 4 Ohms per square centimeter ($\Omega$/cm$^2$), and epitaxial region 130 may have a resistivity of greater than 1000 $\Omega$/cm$^2$. The terms "epitaxial" and "epitaxially formed and/or grown" means the growth of a semiconductor material on a deposition surface of bulk semiconductor substrate 104 may have the same crystalline characteristics as the semiconductor material of the deposition surface.

IC structure 100 also includes an isolation structure 140 under active device 102 in bulk semiconductor substrate 104. Isolation structure 140 includes a trench isolation 142 adjacent active device 102 in bulk semiconductor substrate 104. Trench isolation(s) (TIs) 142 typically include a trench etched into bulk semiconductor substrate 104 and filled with an insulator, to isolate one region of the substrate from an adjacent region of the substrate. Each TI 142 may be formed of electrical insulation material(s), and as examples may include: silicon nitride (Si$_3$N$_4$), silicon oxide (SiO$_2$), fluorinated SiO$_2$ (FSG), hydrogenated silicon oxycarbide (Si-COH), boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. TIs 142 may be provided as a shallow trench isolation (STI) (shown) or a deep trench isolation (DTI). In any event, TIs 142 surround active device 102.

Isolation structure 140 may include a dielectric layer 144 laterally adjacent TI 142 and over active device 102. Dielectric layer 144 may include any now known or later developed dielectric material, such as those used as a capping layer such as but not limited to silicon nitride. As shown in the right side of FIGS. 1-2, dielectric layer 144 fills an opening 145 between adjacent TIs 142. As will be described, opening 145 may be a space normally used for fill material upon which fill structures may be employed to control certain processing and structures formed thereby.

Isolation structure 140 may also include a porous semiconductor layer 146 in bulk semiconductor substrate 104 under dielectric layer 144 laterally adjacent TI(s) 142.

Porous semiconductor layer 146 is not aligned under TI(s) 142. Porous semiconductor layer 146 provides additional resistance to electrically isolate active device 102 from bulk semiconductor substrate 104. Porous semiconductor layer 146 allows IC structure 100 to have electrical isolation that is as good as or better than IC structures built on more expensive, high resistivity SOI substrates. Porous semiconductor layer 146 may include the same material as bulk semiconductor substrate 104 but made porous as described herein. In one example, porous semiconductor layer 146 and bulk semiconductor substrate 104 may include silicon (Si). In one example, porous semiconductor layer 146 has a depth of between 100 nm to 10 micrometers (μm) below a lower surface 148 of TI(s) 142. According to embodiments of the disclosure, TI(s) 142 and porous semiconductor layer 146 do not include the same material.

Isolation structure 140 may also include a polycrystalline isolation layer 150 under active device 102 and TI(s) 142. As illustrated in FIG. 2, epitaxial region 130, where provided, is over polycrystalline isolation layer 150. As will be described herein, polycrystalline isolation layer 150 may be formed by implanting a noble gas ions into bulk semiconductor substrate 104, and annealing. In one example, bulk semiconductor substrate 104 may have a resistivity of less than 4 $\Omega/cm^2$, and polycrystalline isolation layer 150 (and epitaxial region 130) may have a resistivity of greater than 1000 $\Omega/cm^2$. Hence, polycrystalline isolation layer 150 exhibits a high resistance compared to bulk semiconductor substrate 104, and thus acts to electrically isolate an underside of active device 102.

Polycrystalline isolation layer 150 extends under TI(s) 142. However, porous semiconductor layer 146 extends through polycrystalline isolation layer 150. In the FIG. 1 example, polycrystalline isolation layer 150 may include an endwall 152 contacting porous semiconductor layer 146. Similarly, porous semiconductor layer 146 may include a sidewall 154 in contact with polycrystalline isolation layer 150 and bulk semiconductor substrate 104. FIG. 3 shows another embodiment in which portions of porous semiconductor layer 146 may partially extend under TI(s) 142. The portions of porous semiconductor layer 146 that partially extend under TI(s) 142 may be formed as part of the fabrication process, described herein.

Isolation structure 140 thus includes polycrystalline isolation layer 150 under active device 102. Isolation structure 140 also includes dielectric layer 144 and includes porous semiconductor layer 146 in bulk semiconductor substrate 104 under dielectric layer 144 laterally adjacent TI(s) 142. TI(s) 142 are to the side or adjacent to active device 102. TI(s) 142 does not include the same material as porous semiconductor layer 146, e.g., TI(s) 142 may include silicon oxide where porous semiconductor layer 146 includes oxidized porous silicon. Hence, porous semiconductor layer 146 and bulk semiconductor substrate 104 may both include silicon.

Referring to FIGS. 4-8, cross-sectional views of embodiments of a method of forming IC structure 100 are shown.

Figure 4:
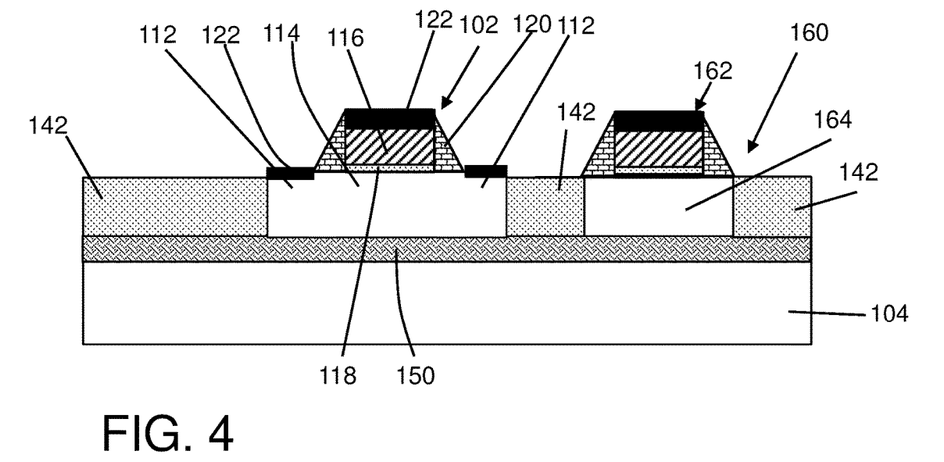
FIG. 4 shows a cross-sectional view of an initial structure for a method according to embodiments of the disclosure.
Figure 5:
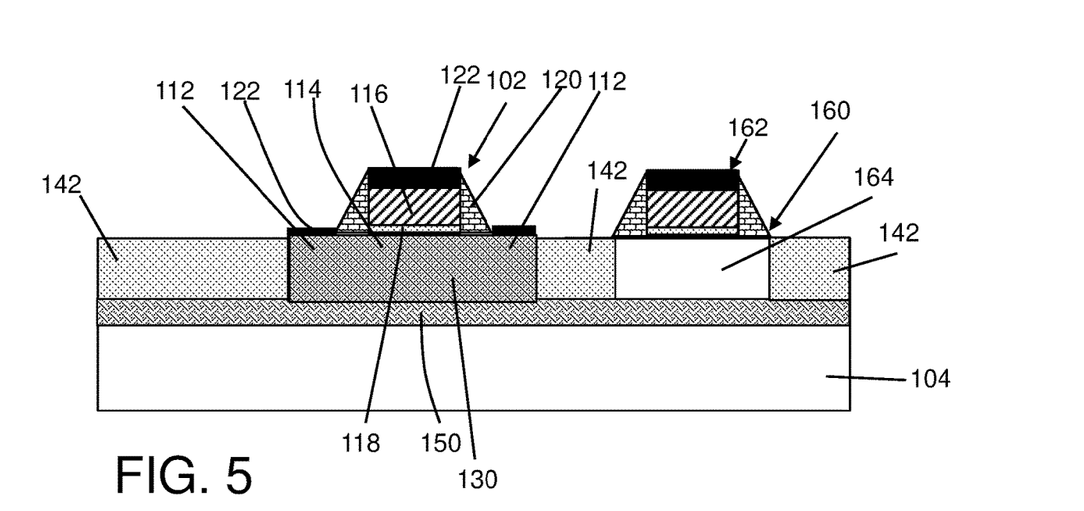
FIG. 5 shows a cross-sectional view of an initial structure for a method according to other embodiments of the disclosure.

FIGS. 4-5 show an initial structure 160. Initial structure 160 has a number of structures already formed therein including, for example, polycrystalline isolation layer 150 and TI(s) 142. While a particular order of steps to form initial structure 160 will be described, it is understood that the order may vary from that detailed here. FIGS. 4-5 show forming an active device such as switch 102 over bulk semiconductor substrate 104. Switch 102 may include gate 116 including gate dielectric layer 118, source/drain regions 112, and silicide 122. At this stage, switch 102 is isolated by TI(s) 142 in bulk semiconductor substrate 104. TI(s) 142 may be formed, for example, by forming trenches in base semiconductor layer 104 and filling the trenches with dielectric, e.g., silicon oxide, and planarizing. Initial structure 160 also includes a dummy gate 162 formed next to switch 102. Switch 102 and dummy gate 162 can be formed using any now known or later developed semiconductor fabrication techniques.

Dummy gate 162 is formed over a fill region 164 of base semiconductor substrate 104 between TI(s) 142. Fill region 164 is semiconductor fill between TIs 142, which is normally used during planarization of TIs 142 to ensure planarity of TIs 142. Dummy gate 162 is normally provided to, for example, ensure uniform spacers 120 on switch 102. Dummy gate 162 aids in controlling spacer 120 deposition and etch back, both of which are sensitive to gate density. Hence, dummy gate 162 provides additional density to control spacer 120 deposition and etch back relative to switch 102. Dummy gate 162 may also provide better control of gate 116 etching, and contact (not shown) topography.

FIG. 4 shows an embodiment without epitaxial region 130 (FIGS. 2 and 5). In the example shown in FIG. 5, forming switch 102 includes forming epitaxial region 130 laterally adjacent TI(s) 142. Epitaxial region 130 may have a resistivity higher than bulk semiconductor substrate 104. Epitaxial region 130 is formed in or on bulk semiconductor substrate 104 prior to switch 102 formation, e.g., by epitaxial growth. As noted, bulk semiconductor substrate 104 may have a resistivity of less than approximately 4.0 $\Omega/cm^2$, and epitaxial region 130 may have a resistivity of greater than approximately 1000 $\Omega/cm^2$.

FIGS. 4 and 5 also show forming polycrystalline isolation layer 150 below switch 102 and TI(s) 142. Polycrystalline isolation layer 150 may be formed prior to formation of switch 102 and dummy gate 162 by, for example, doping an area in base semiconductor substrate 104. There are a number of ways to dope the desired area to form polycrystalline isolation layer 142. In one example, the process may include implanting a dopant into base semiconductor substrate 104. The dopant may be, for example, implanted into monocrystalline semiconductor substrate 104. Implanting or doping is the process of introducing impurities (dopants) into a material. An ion implanter is typically employed for the actual implantation. An inert carrier gas such as nitrogen is usually used to bring in the impurity source (dopant). A dosage and an energy level appropriate for the particular bulk semiconductor substrate 104 and desired doping may be specified and/or a resulting doping level may be specified. An example of doping is implanting with argon (Ar) with a dosage of between about 1E12 and 1E13 atoms/$cm^2$, and an energy of about 40 to 80 keV to produce a doping level of between 1E17 and 1E18 atoms/$cm^3$. In this case, the doping is carried out to damage the monocrystalline material to which it is applied. One or more thermal cycle(s), e.g., an anneal, that re-orders the damaged and disordered crystallographic material into polycrystalline material may be performed. The thermal cycle(s) may include one or more intentionally added recrystallization anneal(s) shortly after implant, or the normal high temperature (>600° C.) process(es) associated with semiconductor manufacturing. In this manner, the process converts monocrystalline bulk semiconductor substrate 104 (under epitaxial region 130, if provided) to polycrystalline isolation layer 150. The dopant implanted may be include any material capable of creating polycrystalline material including but not limited to: germanium (Ge); a noble gas such as argon (Ar) or xenon (Xe); or a combination of the previously listed materials such as Ge—Ar or Ge—Xe. The vertical location at which polycrystalline isolation layer 150 starts and the depth of layer 150 can be controlled by the duration and energy of the ion implanting used. Polycrystalline isolation layer 150 extends under TI(s) 142. Referring to FIG. 5, in an alternative embodiment, polycrystalline isolation layer 150 may be formed in bulk semiconductor substrate 104 prior to epitaxial region 130, and epitaxial region 130 may be formed thereover. In any event, polycrystalline isolation layer 150 may have a resistivity of, for example, greater than 1000 $\Omega/cm^2$, providing relatively strong resistance to current leakage from under switch 102.

Figure 6:
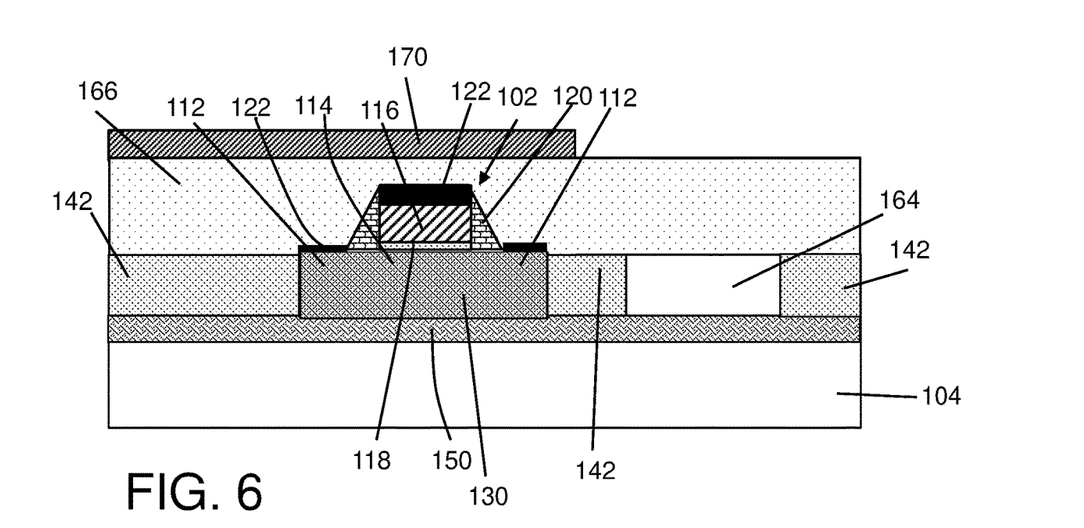
FIG. 6 shows a cross-sectional view of forming a dielectric and mask according to steps of a method, according to embodiments of the disclosure.
Figure 7:
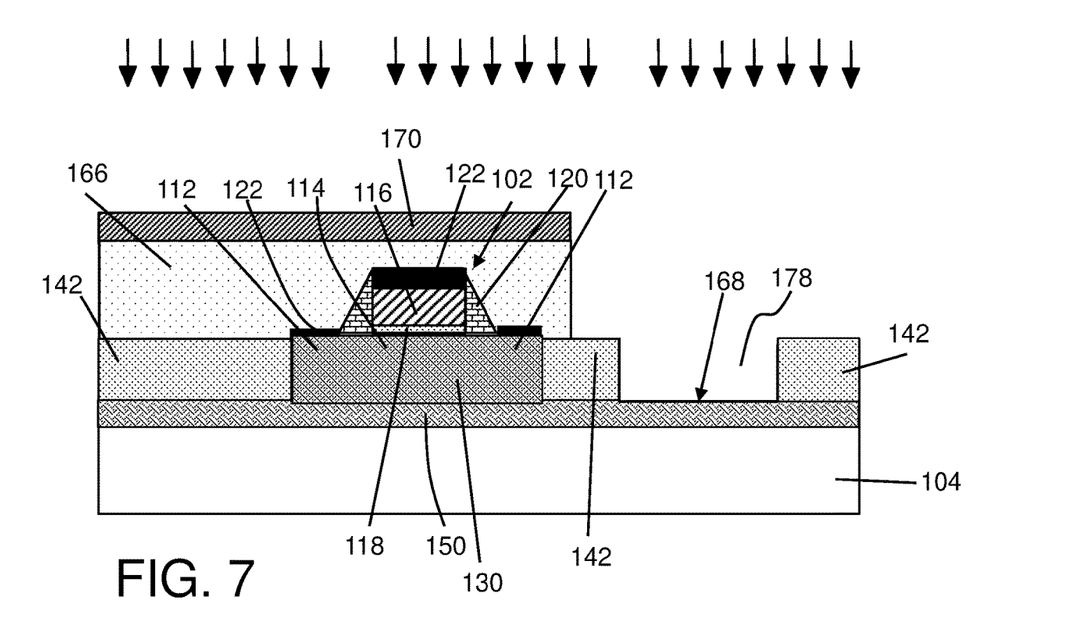
FIG. 7 shows a cross-sectional view of exposing a region of a bulk semiconductor substrate laterally adjacent and below a trench isolation, according to steps of a method according to embodiments of the disclosure.
Figure 8:
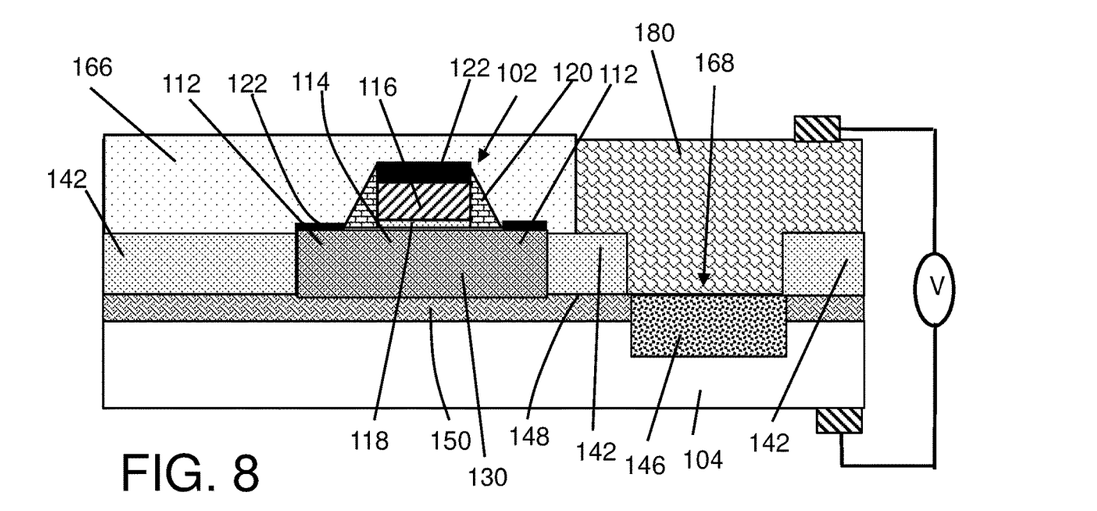
FIG. 8 shows a cross-sectional view of forming a porous semiconductor layer in the region of the bulk semiconductor substrate, according to embodiments of the disclosure.

FIGS. 6-8 show forming porous semiconductor layer 146. (FIGS. 6-8 show the process relative to the FIG. 5 embodiment only, i.e., including epitaxial region 130, for brevity). FIGS. 6-7 show exposing a region 168 (FIG. 7) of bulk semiconductor substrate 104 laterally adjacent and below TI(s) 142. Region 168 may include part of polycrystalline isolation layer 150 in base semiconductor substrate 104. This process may include, for example as shown in FIG. 6, forming a dielectric layer 166 over initial structure 160 (FIGS. 4-5). Dielectric layer 166 will eventually be part of dielectric layer 144, and so may include the same material as dielectric layer 144, e.g., silicon nitride. Dielectric layer 166 may be formed by any appropriate deposition technique(s) for the material formed, e.g., chemical vapor deposition (CVD), atomic layer deposition (ALD), among others. A patterned mask 170 may be used to expose region 168, e.g., by etching. Mask 170 may include any appropriate mask material for the etching process and material (e.g., silicon nitride, silicon) to be etched. As shown in FIG. 7, one or more etching processes (arrows) may be used, e.g., a RIE and/or a wet etch, to expose region 168. For example, one etch may remove dielectric layer 166, another etch may remove dummy gate 162 (FIG. 6), and another etch may remove semiconductor between TIs 142, creating an opening 178 exposing region 168 of bulk semiconductor substrate 104. At this stage, mask 170 can be removed using any appropriate technique, e.g., an ashing process.

FIG. 8 shows forming porous semiconductor layer 146 in exposed region 168 of bulk semiconductor substrate 104 laterally adjacent and below TI 142. The porous layer forming may include, as shown in FIG. 8, exposing region 168 to an electrolyte solution 180, and applying a voltage (V) across bulk semiconductor substrate 104 and electrolyte solution 180. Dielectric layer 166 protects switch 102 from electrolyte solution 180. While a variety of techniques are possible, in one example, electrolyte solution 180 may include hydrofluoric (HF) acid that etches the semiconductor material and makes it porous. Other techniques for forming a porous semiconductor layer are known, and thus no additional details are necessary. A depth and width of porous semiconductor layer 146 can be controlled by, for example, the duration of electrolyte solution 180 application, the electrolyte material and concentration, and the voltage applied. In one example, porous semiconductor layer 146 may have a depth of between 100 nanometers (nm) to 10 micrometers (μm) below lower surface 148 of TI 142. As shown in FIG. 8, porous semiconductor layer 146 may be aligned with opening 178. Alternatively, as shown in FIG. 3, portions of porous semiconductor layer 146 may partially extend under TIs 142, e.g., where a duration of the exposure to electrolyte solution 180 and the voltage allow conversion of base semiconductor substrate 104, including parts of polycrystalline isolation layer 150, to reach under TI(s) 142. In any event, porous semiconductor layer 146 extends through polycrystalline isolation layer 150. That is, parts of polycrystalline isolation layer 150 are converted to porous semiconductor layer 146. As shown in FIGS. 1-3, porous semiconductor layer 146 may include sidewall 154 in contact with polycrystalline isolation layer 150 and bulk semiconductor substrate 104. Polycrystalline isolation layer 150 includes endwall 152 in contact with porous semiconductor layer 146. Hence, porous semiconductor layer 146 does not constitute an entirety of substrate 104 nor does it extend along an entire length of substrate 104.

Returning to FIGS. 1-3, forming a dielectric layer 190 over porous semiconductor layer 146 and switch 102 is shown. This process may also include forming a remaining portion 144X of dielectric layer 144 over porous semiconductor layer 146. Hence, dielectric layer 144 extends over porous semiconductor layer 146 in opening 145 laterally adjacent TI 142, and dielectric layer 144 extends over switch 102. Additional, dielectric layer(s) 190 may be formed over dielectric layer 144. Dielectric layer(s) 190 may include any now known or later developed interlayer dielectric materials. Dielectric layers 144X and 190 may be formed by any appropriate deposition technique, e.g., CVD, ALD, among others. Any necessary planarization step may then occur, e.g., chemical mechanical planarization, to remove any excess insulator 190. Any back-end-of-line (BEOL) interconnects (not shown) may be formed to switch 102.

Embodiments of the disclosure provide IC structure 100 that uses a lower cost, low resistivity bulk semiconductor substrate 104 rather than a more expensive, higher resistivity SOI substrate. Despite the lower cost substrate, IC structure 100 with isolation structure 140 has better performance characteristics than a device in an SOI substrate, e.g., for radio frequency (RF) switches. For example, IC structure 100 exhibits better current leakage, harmonic distortion, cross-talk resistance, effective resistivity, effective permittivity, and attenuation, compared to current SOI substrate devices. One example SOI n-type field effect (NFET) RF switch that includes a high resistivity polycrystalline isolation layer exhibits a leakage current of approximate 10 micro-Amperes (μA). In contrast, a similar NFET RF switch 102 employing IC structure 100 according to embodiments of the disclosure may exhibit a leakage current of less than 1 μA. Other operational parameters exhibit similar improvements. Despite the improved performance, using semiconductor porous layer 146 in a fill region in middle-of-line films makes the method of forming IC structure 100 and switch 102 low-cost without affecting other structures and surfaces.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   an active device over a bulk semiconductor substrate; and
   an isolation structure under the active device in the bulk semiconductor substrate, the isolation structure including:
   a trench isolation adjacent the active device in the bulk semiconductor substrate,
   a dielectric layer laterally adjacent the trench isolation and over the active device,
   a porous semiconductor layer in the bulk semiconductor substrate under the dielectric layer laterally adjacent the trench isolation, and
   a polycrystalline isolation layer under the active device and the trench isolation, the porous semiconductor layer extending through the polycrystalline isolation layer.

2. The IC structure of claim 1, wherein the polycrystalline isolation layer includes an endwall contacting the porous semiconductor layer.

3. The IC structure of claim 1, wherein the porous semiconductor layer includes a sidewall in contact with the polycrystalline isolation layer and the bulk semiconductor substrate.

4. The IC structure of claim 1, wherein the active device includes an epitaxial region over the polycrystalline isolation layer, wherein the epitaxial region has a resistivity higher than the bulk semiconductor substrate.

5. The IC structure of claim 4, wherein the bulk semiconductor substrate has a resistivity of less than 4 Ohms per square centimeter ($\Omega/cm^2$), and the epitaxial region and the polycrystalline isolation layer have a resistivity of greater than 1000 $\Omega/cm^2$.

6. The IC structure of claim 1, wherein the porous semiconductor layer extends partially under the trench isolation.

7. The IC structure of claim 1, wherein the active device includes a radio frequency (RF) switch.

8. The IC structure of claim 1, wherein the porous semiconductor layer and the bulk semiconductor substrate include silicon.

9. The IC structure of claim 1, wherein the porous semiconductor layer has a depth of between 100 nanometers (nm) to 10 micrometers (μm).

10. A radio frequency (RF) switch, comprising:
    an active device over a bulk semiconductor substrate; and
    an isolation structure under the active device in the bulk semiconductor substrate, the isolation structure including:
    a trench isolation adjacent the active device in the bulk semiconductor substrate,
    a polycrystalline isolation layer under the active device and the trench isolation,
    a dielectric layer laterally adjacent the trench isolation and over the active device, and
    a porous semiconductor layer in the bulk semiconductor substrate under the dielectric layer laterally adjacent the trench isolation, the porous semiconductor layer extending through the polycrystalline isolation layer.

11. The RF switch of claim 10, wherein the porous semiconductor layer includes a sidewall in contact with the polycrystalline isolation layer and the bulk semiconductor substrate.

12. The RF switch of claim 10, wherein the active device includes an epitaxial region over the polycrystalline isolation layer, wherein the epitaxial region has a resistivity higher than the bulk semiconductor substrate.

13. The RF switch of claim 12, wherein the bulk semiconductor substrate has a resistivity of less than 4 Ohms per square centimeter ($\Omega/cm^2$), and the epitaxial region and the polycrystalline isolation layer have a resistivity of greater than 1000 $\Omega/cm^2$.

14. The RF switch of claim 10, wherein the porous semiconductor layer extends partially under the trench isolation.

15. The RF switch of claim 10, wherein the porous semiconductor layer and the bulk semiconductor substrate include silicon.

* * * * *